(12) United States Patent
Subramanian et al.

(10) Patent No.: US 10,747,249 B1
(45) Date of Patent: Aug. 18, 2020

(54) REFERENCE BUFFER WITH INTEGRATION PATH, ON-CHIP CAPACITOR, AND GAIN STAGE SEPARATE FROM THE INTEGRATION PATH

(71) Applicant: TEXAS INSTRUMENTS INCORPORATED, Dallas, TX (US)

(72) Inventors: Anand Subramanian, Bengaluru (IN); Anand Kannan, Benagluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/448,928

(22) Filed: Jun. 21, 2019

(51) Int. Cl.
*G05F 1/575* (2006.01)
*H03H 7/06* (2006.01)
*H03M 1/12* (2006.01)

(52) U.S. Cl.
CPC ............... *G05F 1/575* (2013.01); *H03H 7/06* (2013.01); *H03M 1/12* (2013.01)

(58) Field of Classification Search
None
See application file for complete search history.

(56) References Cited

U.S. PATENT DOCUMENTS

| | | | |
|---|---|---|---|
| 6,246,221 B1 | 6/2001 | Xi | |
| 7,205,828 B2 | 4/2007 | Sridharan | |
| 8,022,681 B2 | 9/2011 | Gurcan | |
| 8,237,425 B1 * | 8/2012 | Smith | G05F 1/575 323/280 |
| 9,535,439 B2 | 1/2017 | Jain et al. | |
| 9,541,973 B2 | 1/2017 | Yang et al. | |
| 9,552,006 B1 * | 1/2017 | Gorecki | G05F 1/565 |
| 10,054,969 B2 | 8/2018 | Subramanian et al. | |
| 2006/0033555 A1 | 2/2006 | Sridharan | |
| 2008/0174289 A1 | 7/2008 | Gurcan et al. | |
| 2010/0072964 A1 | 3/2010 | Qiu et al. | |
| 2011/0163799 A1 | 7/2011 | Kuang et al. | |
| 2013/0033305 A1 | 2/2013 | Fukazawa et al. | |
| 2016/0334818 A1 | 11/2016 | Singh et al. | |
| 2016/0334819 A1 | 11/2016 | Pelicia et al. | |

OTHER PUBLICATIONS

Linear Technology Corporation, "LTC2338-18," Copyright Linear Technology Corporation 2016, 26 pp. [Online] www.linear.com/LTC2338-18.
Kumar, V., "18-Bit, 1MSPS Data Acqusition Block (DAQ) Optimized for Lowest Distortion and Noise," SLAU515A Jun. 2013, Revised Oct. 2015, 36 pp.

* cited by examiner

*Primary Examiner* — Jeffery S Zweizig
(74) *Attorney, Agent, or Firm* — John R. Pessetto; Charles A. Brill; Frank D. Cimino

(57) ABSTRACT

A system includes: a reference buffer coupled to an input supply voltage; an analog-to-digital converter (ADC) coupled to an output of the reference buffer; and an output capacitor coupled between the output of the reference buffer and a ground node. The reference buffer includes: an integrator; an internal capacitor coupled between an output of the integrator and the ground node; a first gain stage with an input coupled to the output of the reference buffer; and a second gain stage with an input coupled to the output of the integrator. The output of the first gain stage is combined with the output of the integrator using a combine circuit.

20 Claims, 8 Drawing Sheets

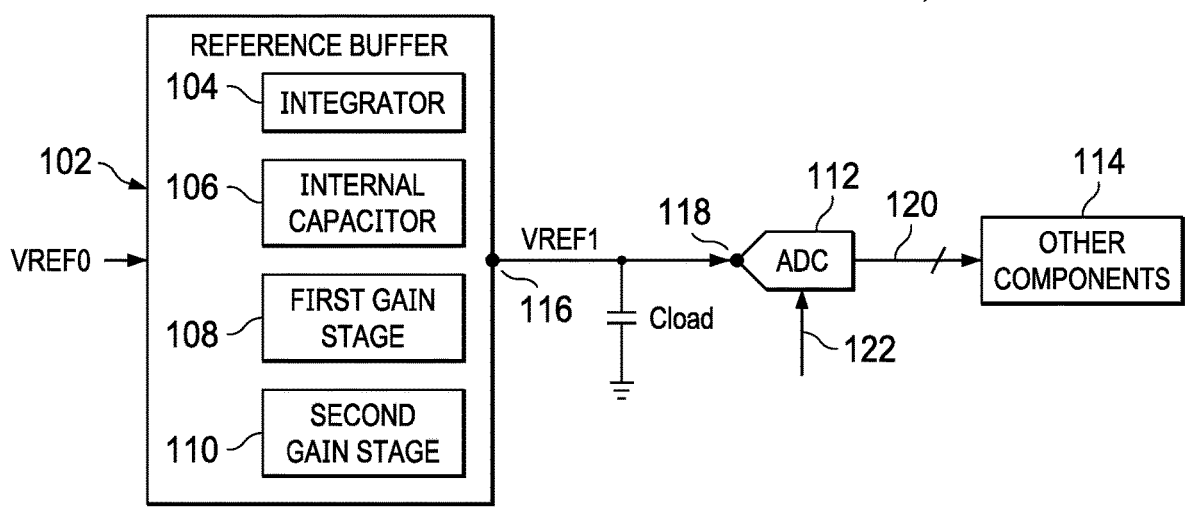
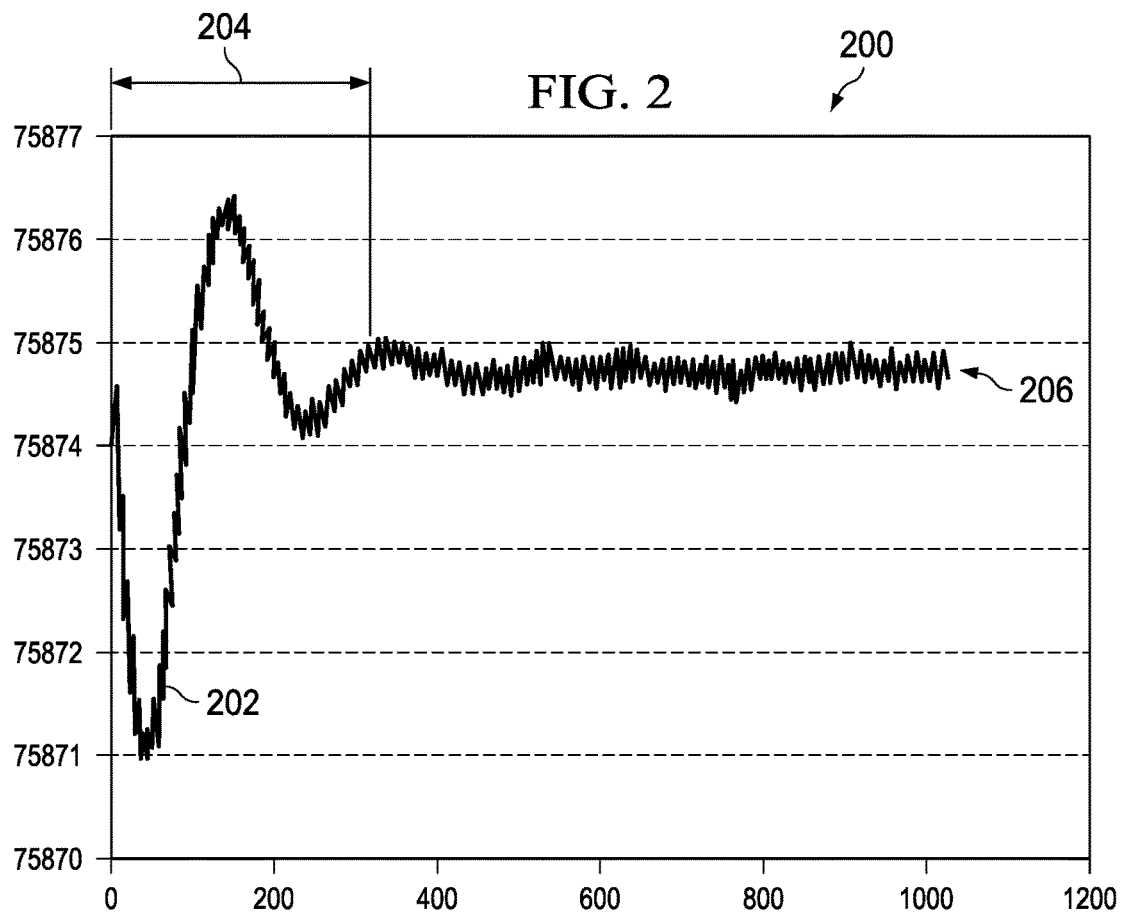

REFERENCE BUFFER WITH INTEGRATION PATH, ON-CHIP CAPACITOR, AND GAIN STAGE SEPARATE FROM THE INTEGRATION PATH

BACKGROUND

The accuracy of some electronic circuits is a function of a reference voltage. As an example, the reference voltage provided to an analog-to-digital converter (ADC) is used to generate the digital values output from the ADC. If the reference voltage is inaccurate or vanes over time, the ADC accuracy is negatively affected. Some factors that can affect reference voltage accuracy include power consumption variability and the desired data rate of the circuit receiving the reference voltage. In one scenario, a reference buffer is added between a reference voltage source and an ADC to help maintain reference voltage accuracy even if the power consumption of the ADC vanes over time. However, use of a reference buffer in this scenario increases cost and overall circuit size, Efforts to improve reference buffers are ongoing.

SUMMARY

In accordance with at least one example of the disclosure, a system comprises a reference buffer coupled to an input supply voltage. The system also comprises an analog-to-digital converter (ADC) coupled to an output of the reference buffer. The system also comprises an output capacitor coupled between the output of the reference buffer and a ground node. The reference buffer comprises an integrator and an internal capacitor coupled between an output of the integrator and the ground node. The reference buffer also comprises a first gain stage with an input coupled to the output of the reference buffer, wherein an output of the first gain stage is combined with the output of the integrator using a combine circuit. The reference buffer also comprises a second gain stage with an input coupled to the output of the integrator.

In accordance with at least one example of the disclosure, an integrated circuit, comprises a reference buffer having an integrator and a capacitor coupled between an output of the integrator and a ground node. The reference buffer also has a first gain stage with an input coupled to an output of the reference buffer, wherein an output of the first gain stage is coupled to an output of the integrator via a combine circuit. The reference buffer also has a second gain stage with an input coupled to the output of the integrator.

In accordance with at least one example of the disclosure, a reference buffer circuit comprises an integrator and a capacitor coupled between an output of the integrator and a ground node. The reference buffer circuit also comprises a first gain stage with a low-pass feedback loop. The first gain stage has an input coupled to an output of the reference buffer circuit. Also, an output of the first gain stage is combined with the output of the integrator. The reference buffer circuit also comprises a second gain stage with a first input coupled to the output of the integrator and with a second input coupled to the output of the first gain stage.

BRIEF DESCRIPTION OF THE DRAWINGS

For a detailed description of various examples, reference will now be made to the accompanying drawings in which:

FIG. 1 is a block diagram showing a system in accordance with some examples;

FIG. 2 is a timing diagram showing a reference voltage waveform as a function of time in accordance with some examples;

DETAILED DESCRIPTION

Figure 3:
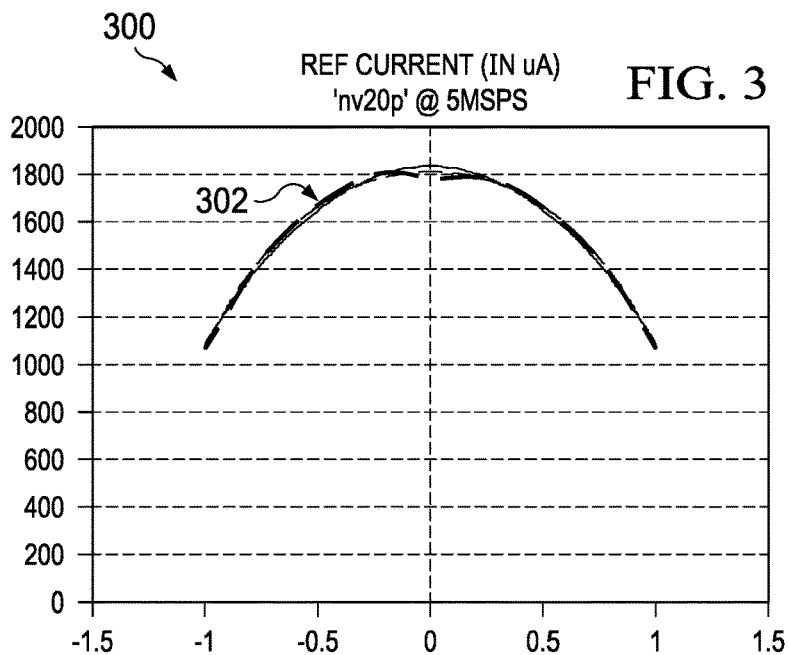
FIG. 3 is a graph showing reference current draw as a function of normalized input voltage (VIN) for an analog-to-digital converter (ADC) in accordance with some examples.

Disclosed herein are reference buffer topologies with an integration path, an on-chip capacitor, and a gain stage separate from the integration path. In some examples, a reference buffer includes an integrator and an internal capacitor coupled between an output node of the integrator and a ground node. The reference buffer also includes a first gain stage with an input node coupled to the output node of the reference buffer, where the output node of the first gain stage is coupled to the output node of the integrator. The reference buffer also includes a second gain stage with an input node coupled to the output node of the integrator. In some examples, a low-pass feedback loop is used with the first gain stage to limit the gain at lower frequencies (to avoid saturating the first gain stage).

With the disclosed reference buffer topologies, a single integrated circuit solution is possible with only one external capacitor to reduce the pin count (reducing chip size). Also, the low-pass feedback loop for the first gain stage reduces low-frequency noise (e.g., flicker noise) compared to other reference buffer topologies. Also, use of an on-chip (internal) capacitor by the disclosed reference buffer topologies improves reference buffer performance in industrial (high vibration) scenarios compared to reference buffers that use an external multi-layer ceramic (MLCC) capacitor (subject to inaccuracies due to piezoelectric stresses). Also, the disclosed reference buffer topologies have low quiescent current (Iq), which supports loop powered scenarios with a target power consumption of <10 mW total system power. In some examples, the disclosed reference buffer topologies are used to provide a reference voltage to an analog-to-digital converter (ADC). In other examples, reference buffers are used in scenarios where the amount of direct-current (DC) drive needed is larger than what a bandgap voltage reference can provide. To provide a better understanding, various reference buffer options are described using the figures as follows.

FIG. 1 is a block diagram showing a system 100 in accordance with some examples. In different examples, the system 100 corresponds to one or more integrated circuits (ICs) or chips, a multi-die modulate (MDM), and/or discrete components. As desired, a printed circuit board (PCB) may be used to mount and interconnect different components of the system 100. As shown, the system 100 includes a reference buffer 102 that receives an input reference voltage (VREF0) and that provides an output reference voltage (VREF1), where VREF1 is a buffered version of VREF0. In the example of FIG. 1, VREF1 is provided to a capacitor (Cload), where a first (e.g., top) plate of Cload is coupled to an output node 116 of the reference buffer 102 and to an input node 118 of the ADC 112. The second (e.g., bottom) plate of Cload is coupled to a ground node. The output of the ADC 112 is a digital signal 120 based on the VREF1 and an input signal 122. In the example of FIG. 1, the digital signal 120 is provides to other components 114 such as storage elements (e.g., registers, memory, etc.), microprocessors, or other components.

As shown, the reference buffer 102 includes an integrator 104, an internal (on-chip) capacitor 106, a first gain stage 108, and a second gain stage 110. In some examples, the internal capacitor 106 coupled between an output node of the integrator 104 and a ground node. In other examples, an external capacitor is coupled between the output node of the integrator 104 and a ground node. With an external capacitor, an extra pin is used. Also, an input node of the first gain stage 108 is coupled to the output node 116 of the reference buffer 102. Also, an output node of the first gain stage 108 is coupled to the output node of the integrator 104. Also, an input node of the second gain stage 110 is coupled to the output node of the integrator 104.

In some examples, the first gain stage 108 includes a first voltage amplifier and the second gain stage 110 includes a second voltage amplifier. Also, the reference buffer 102 further comprises a transconductance gain stage between an output node of the second gain stage 110 and the output node 116 of the reference buffer 102. In some examples, a voltage addition circuit (see e.g., the voltage addition circuit 812 of FIG. 8)) of the reference buffer 102 is configured to add the output of the integrator 104 to an output of the first gain stage 108, wherein an output node of the voltage addition circuit is coupled to the input node of the second gain stage 110.

In some examples, the reference buffer 102 includes a low-pass feedback loop (see e.g., the low-pass feedback loop 1002 of FIG. 10) for the first gain stage 108. More specifically, the low-pass feedback loop along with the integrator 104 may be configured to apply a second-order filter. In one example, the low-pass feedback loop 1002 is first order, while the low-pass feedback loop 1002 along with the integrator 104 give second order filtering for noise introduced by the first gain stage 110.

In some examples, the reference buffer 102 is part of a single integrated circuit, where the first-order filter, the internal capacitor, and a gain of the first gain stage 108 are selected to provide a predetermined noise level and distortion level at the output node 116 of the reference buffer 102 using Cload as the only external capacitor for the reference buffer 102. In some examples, the bandwidth for the reference buffer 102 is a function of the second-order filter (in the low-pass feedback loop for the first gain stage 108) and the integrator 104.

FIG. 2 is a timing diagram 200 showing a reference voltage waveform 202 as a function of time in accordance with some examples. As shown, the reference voltage related to the waveform 202 is unstable during interval 204 before reaching a settled value 206. The duration of the interval 204 increases the latency of any component that relies on the reference voltage. For example, ADC operations that rely on the reference voltage related to the waveform 202 may be paused during interval 204 to ensure accuracy at the expense of data rate. In at least some examples, the disclosed reference buffer topologies reduce the interval 204 (reducing overall system latency) compared to other reference buffers.

FIG. 3 is a graph 300 showing a reference current draw 302 as a function of normalized input voltage (VIN) for an ADC in accordance with some examples. In the example of graph 300, the X axis is VIN/VREF (and thus VIN is normalized with respect to VREF) and the Y axis is current (in µA). The input current draw 302 in the presence of finite output impedance of a reference buffer (e.g., the reference buffer 102 in FIG. 1) leads to higher levels of total harmonic distortion (THD).

Figure 4:
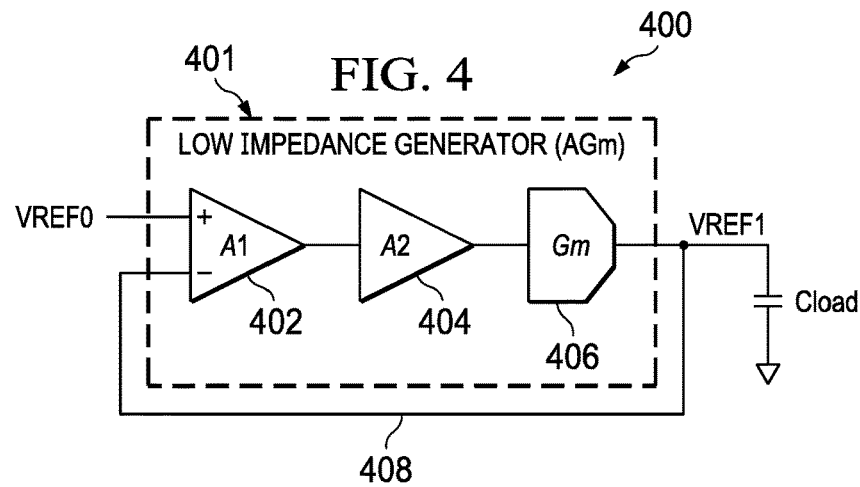
FIG. 4-7 are schematic diagrams showing different reference buffer arrangements in accordance with some examples.

FIG. 4-7 are schematic diagrams showing different reference buffer arrangements in accordance with some examples. In the reference buffer arrangement 400 of FIG. 4, a reference buffer 401 with a first gain stage 402, a second gain stage 404, and a transconductance gain (Gm) stage 406 is represented. Also, Cload is represented at the output of the reference buffer 401. As shown, the input to the first gain stage 402 is a reference voltage (VREF0) and a feedback voltage (VREF1) from the output of the reference buffer 401. In the example of FIG. 4, the first and second gain stages 402 and 404 provide a gain of 2500, which boosts the output stage transconductance for the transconductance gain stage 406 (e.g., 8 mS into the 20S (50 m ohm) of total conductance). With the reference buffer arrangement 400, the first gain stage 402 contributes to wide band noise of the reference buffer 401.

Figure 5:
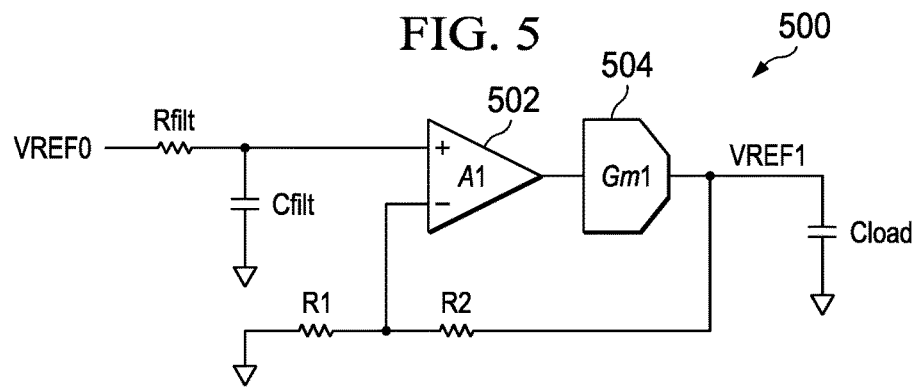

In the reference buffer arrangement 500 of FIG. 5, a first gain stage 502 and a transconductance gain stage 504 are represented. Also, Cload is represented at the output of the transconductance gain stage 504. As shown, one of the inputs to the first gain stage 502 is a reference voltage (VREF0) fed through an RC filter formed by Rfilt and Cfilt. The other input from the first gain stage 502 is VREF1 divided using a voltage divider formed by R1 and R2.

In the example of FIG. 5, the first gain stage 502 and the transconductance gain stage 504 should be designed to have low output impedance (hence high bandwidth) for low distortion/burst mode support. Also, the first gain stage 502 should be designed to have good wide band performance and low flicker noise. Designing for both low frequency noise (e.g., flicker noise) and good high frequency performance involves significant power consumption or high bandwidth. Also, low flicker noise transistors are not readily available. If the first gain stage 502 is designed with available components to meet both integrated noise over a wide bandwidth and low peak-to-peak noise in 0.1 Hz to 10 Hz range, there is a significant power penalty. Also, noise from R1 and R2 is integrated over the entire band, leading to high current consumption for low noise. In the example of FIG. 5, the RC filter formed by Rfilt and Cfilt are able to filter out the noise of the band gap. In some examples, the reference buffer arrangement 500 has the following behavior:

$$\overline{E_{R_1}} = \overline{e_{R_1}} \times \frac{R_2}{R_1} \times BW_{BUF}, \qquad \text{Equation (1)}$$

$$\overline{E_{R_2}} = \overline{e_{R_2}} \times BW_{BUF}, \text{ and} \qquad \text{Equation (2)}$$

$$\overline{E_{A_1}} = \overline{e_{A_1}} \times BW_{BUF}. \qquad \text{Equation (3)}$$

In equations 1-3, $\overline{E_{R_1}}$ is the noise at the output of the reference buffer arrangement 500 due to R1, $\overline{e_{R_1}}$ is the noise of R1 at the point of its addition, $\overline{E_{R_2}}$ is the noise at the output of the reference buffer arrangement 500 due to R2, $\overline{e_{R_1}}$ is the noise of R2 at the point of its addition, $\overline{E_{A_1}}$ is the noise at the output of the reference buffer arrangement 500 due to the first gain stage (A1), $\overline{e_{A_1}}$ is the noise of A1 at the point of its addition, $R_1$ is R1 in FIG. 5, $R_2$ is R2 in FIG. 5, and $BW_{BUFF}$ is the bandwidth of the reference buffer arrangement 500.

Figure 6:
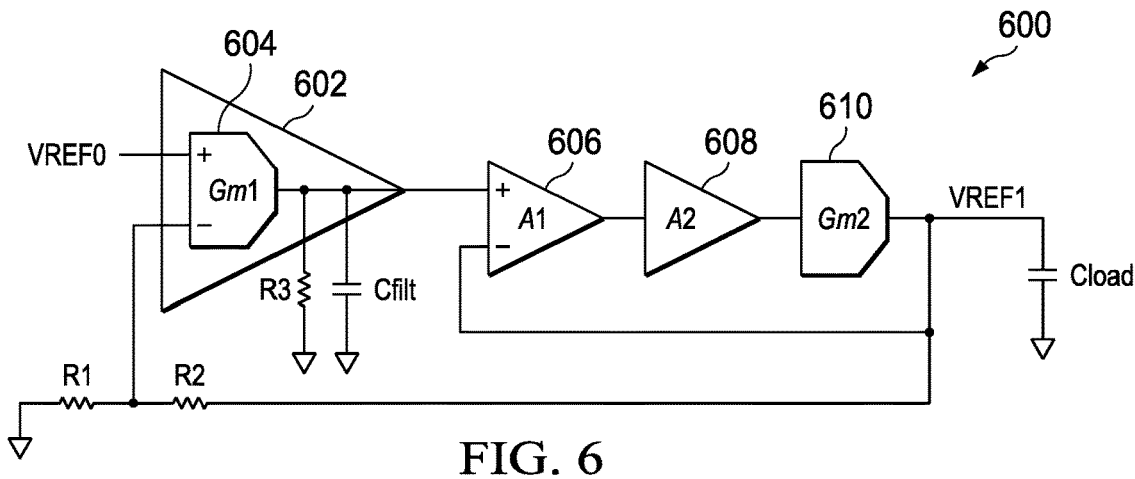

In the reference buffer arrangement 600 of FIG. 6, a front-end integrator 602 (shown with a transconductance gain stage 604 and resistor R3) receives VREF0 at one of its input nodes. The reference buffer arrangement 600 also includes a first gain stage 606, a second gain stage 608, and another transconductance gain stage 610. Also, Cload is represented at the output of the transconductance gain stage 610. Between the integrator 602 and one of the input nodes of the first gain stage 606 is a filtering capacitor (Cfilt), where a first (e.g., top) plate of the Cfilt is coupled to the output of the integrator 602 and to one of the input nodes of the first gain stage 606. The second (e.g., bottom) plate of Cfilt is coupled to a ground node. Also, VREF1 is fed back to the other input node of the first gain stage 606. Also, a voltage divider formed by R1 and R2 is used between the output of the reference buffer arrangement 600 and a second input node of the integrator 602.

In the example of FIG. 6, the bandwidth of the integrator 602 is much lower than the bandwidth of AGm stage (the first gain stage 606, the second gain stage 608, and the transconductance gain stage 610) for stability. Although the integrator 602 filters noise at the input of the reference buffer arrangement 600, the integrator 602 also filters low frequency noise of the AGm stage. In the example of FIGS. 6, R1 and R2 noise only occurs over the bandwidth of the integrator 602 and not over the bandwidth of the AGm stage, which results in lower power consumption. In the example of FIG. 6, the integrator 602 does not need to be high bandwidth, hence it can be made with low flicker noise devices. Examples of low flicker noise devices include bipolar junction transistors (BJTs) with poor ft (ft=the maximum bandwidth for a given transistor), or large sized metal-oxide-semiconductor (MOS) devices with poor ft at low power). In the example of FIG. 6, the first gain stage 606 of the AGm stage needs to be designed only for thermal noise and wideband performance. This is because the offset and low frequency noise (also known as flicker noise) of the first gain stage 606 is eliminated by the integrator 602. Thus, the first gain stage 606 can be made up of a more noise efficient topology such as a single input transistor stage, instead of differential stage.

In some examples, the reference buffer arrangement 600 has the following behavior:

$$\beta = 1 + \frac{R_2}{R_1}, \quad \text{Equation (4)}$$

$$\overline{E_{BG}} \approx \overline{e_{BG}} \times \frac{\beta}{1 + \frac{s\beta C_1}{Gm_1}}, \quad \text{Equation (5)}$$

$$\overline{E_{Gm_1}} \approx \overline{e_{Gm_1}} \times \frac{\beta}{1 + \frac{s\beta C_1}{Gm_1}}, \quad \text{Equation (6)}$$

$$\overline{E_{A_2}} \approx \overline{e_{A_2}} \times \frac{s}{s + \frac{Gm_1}{\beta C_1}} \times BW_{A_2}, \quad \text{Equation (7)}$$

$$\overline{E_{R_1}} \approx \overline{e_{R_1}} \times \frac{(\beta - 1)}{1 + \frac{s\beta C_1}{Gm_1}}, \text{ and} \quad \text{Equation (8)}$$

$$\overline{E_{R_2}} \approx \overline{e_{R_2}} \times \frac{1}{1 + \frac{s\beta C_1}{Gm_1}}. \quad \text{Equation (9)}$$

In equations 4-9, β is the feedback factor, $R_1$ is R1 in FIG. 6, $R_2$ is $R_2$ in FIG. 6, $\overline{E_{BG}}$ is the noise at the output of the reference buffer arrangement 600 due to the bandgap, $\overline{e_{BG}}$ is the noise of the bandgap at the point of its addition, s is frequency, $C_1$ is the value of Cfilt in FIG. 6, $Gm_1$ is gain of the transconductance gain stage 604, $\overline{E_{Gm_1}}$ is the noise at the output of the reference buffer arrangement 600 to the transconductance gain stage 604, $\overline{e_{Gm_1}}$ is the noise of the transconductance gain stage 604 at the point of its addition, $\overline{E_{A_2}}$ is the noise at the output of the reference buffer arrangement 600 due to the second gain stage 608 (A2), $\overline{e_{A_2}}$ is the noise of the second gain stage 608 at the point of its addition, $BW_{A_2}$ is the bandwidth of the second gain stage 608, $\overline{E_{R_1}}$ is the noise at the output of the reference buffer arrangement 600 due to R1, $\overline{e_{R_1}}$ is the noise of R1 at the point of its addition, $\overline{E_{R_2}}$ is the noise at the output of the reference buffer arrangement 600 due to R2, and $\overline{e_{R_2}}$ is the noise of R2 at the point of its addition.

In the example of FIG. 6, the bandwidth of the integrator 602 is less than the bandwidth of AGm stage. This means the noise of the integrator 602 will be present in VREF1, where the noise and bandwidth of the integrator 602 are a function of the transconductance stage 604. In some examples, the noise is approximated as ~KT/C, where K is the Boltzmann constant, T is temperature (in Kelvin), and C is capacitance.

For low noise designs Cfilt would need to be very large, such that two external capacitors (Cfilt and Cload are needed to the buffer reference arrangement 600 of FIG. 6. This leads to higher costs and larger chip size, which may be unsuitable for certain scenarios such as a very low noise integrated reference buffer for ADC operations. As an example, if a noise number of 5 uV is targeted (~2 uV allocated to the integrator 602), Cfilt would be >700 pF (e.g., an external capacitor of 1 uF). If an MLCC is used for the external Cfilt, there is a significant piezoelectric effect in presence of vibrations, which results in additional noise in VREF1.

In some examples, the reference buffer arrangement 600 has the following behavior:

$$V_{nout} = \frac{V_{nBUF}}{1 + \frac{Gm_1}{sC_{FILT}}}, \quad \text{Equation (10)}$$

$$V_{nout} = \frac{V_{nGm_1}}{1 + \frac{sC_{FILT}}{Gm_1}}, \quad \text{Equation (11)}$$

$$Z_1 = \frac{Gm_1}{C_{FILT}} \ll BW_{BUF}, \text{ and} \quad \text{Equation (12)}$$

$$V_{nout(Gm_1)} = \frac{KT}{C_{FILT}}. \quad \text{Equation (13)}$$

In equations 10-13, $V_{nout}$ is the noise at the output of the reference buffer arrangement 600, $V_{nGm_1}$ is the noise at the output of the reference buffer arrangement 600 due to the transconductance gain stage 604, s is frequency, $C_{FILT}$ is the value of Cfilt in FIG. 6, $Z_1$ is the impedance of transconductance gain stage 604, $Gm_1$ is the value of the transconductance gain stage 604, $BW_{BUF}$ is the bandwidth of the reference buffer arrangement 600, $V_{nout(Gm_1)}$ is the noise at the output of the reference buffer arrangement 600 due to the transconductance gain stage 604, K is the Boltzmann constant, and T is temperature (in Kelvin).

Figure 7:
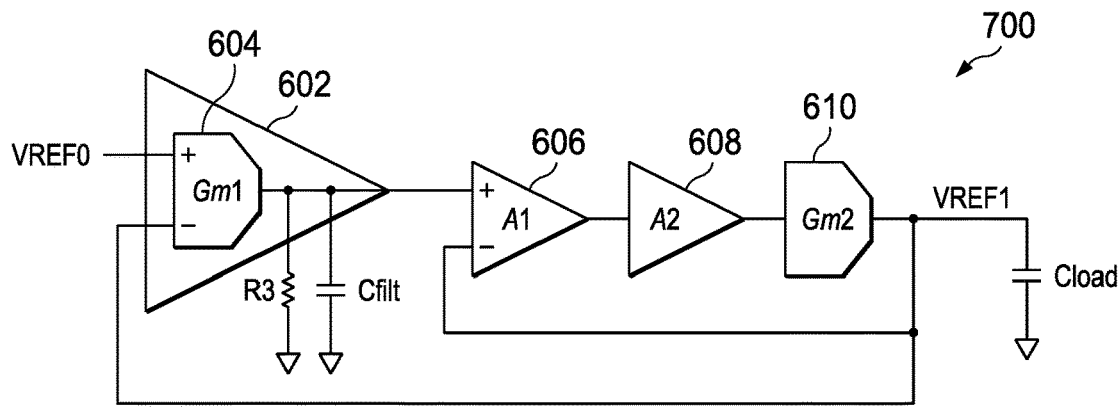

In the reference buffer arrangement 700 of FIG. 7, the same components described in the reference buffer arrangement 600 of FIG. 6 are represented with R1 and R2 removed (no voltage divider between VREF1 and the second input node of the integrator 602). In the reference buffer arrangement 700, the noise from the integrator 602 is integrated until the frequency of the zero $$\left( f_Z = \frac{Gm_1}{2\pi C_{FILT}} \right).$$

If Gm1 is increased, the noise power spectral density (PSD) of the integrator 602 decreases, but the zero frequency ($f_z$) increases and hence the integrated noise stays the same $$\left( \frac{KT}{C_{FILT}} \right).$$

If Gm1 is increased but the zero frequency is not increased, there is a noise benefit available.

Figure 8:
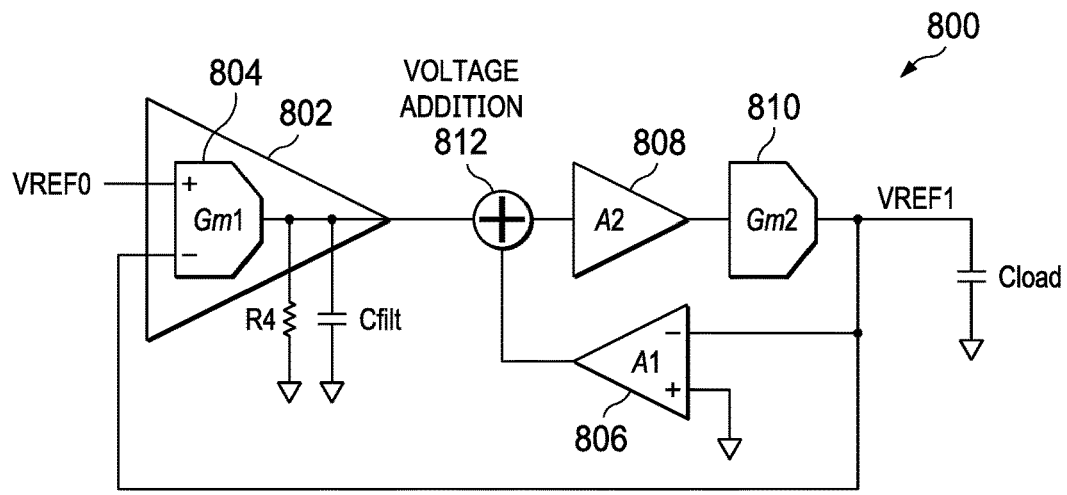
FIG. 8 is a schematic diagram showing another reference buffer arrangement in accordance with some examples.

FIG. 8 is a schematic diagram showing another reference buffer arrangement 800 in accordance with some examples. In the reference buffer arrangement 800 of FIG. 8, a front-end integrator 802 (shown with a transconductance gain stage 804 and resistor R4) receives VREF0 at one of its input nodes. The reference buffer arrangement 800 also includes a first gain stage 806, a second gain stage 808, and another transconductance gain stage 810. Also, Cload is represented at the output of the transconductance gain stage 810.

In the reference buffer arrangement 800, the first gain stage 806 is separate from the integration path formed by the integrator 802, the second gain stage 808, and the transconductance gain stage 810. More specifically, in the example of FIG. 8, the first gain stage 806 has one input node coupled to VREF1, and another input node coupled to a ground node. The output node of the first gain stage 806 is add to the output of the integrator 802 by a voltage addition circuit 812, where the output of the voltage addition circuit 812 is provided to the second gain stage 808. As shown, the output of the second gain stage 808 is provided to the transconductance gain stage 810, which outputs VREF1.

With the reference buffer arrangement 800, the noise PSD of the transconductance gain stage 804 stays the same, but the zero frequency up to where the noise of transconductance gain stage 804 is integrated decreases to $$f_Z = \frac{Gm_1}{2\pi \times A1 \times C_{FILT}}.$$

In other words, for the same zero frequency, the gain (A1) of the first gain stage 806 can be A1 times higher than the gain (Gm 1) of the transconductance gain stage 804. In some examples, the integrated noise of the integrator 802 becomes $$\frac{KT}{A1 \times C_{FILT}}.$$

The limits on how high A1 can be are due to the difference is offset between A1 and Gm1, which appears at the output of the first gain stage 806. As A1 keeps increasing, the offset can cause the output of the first gain stage 806 to saturate and go out of bias. This limits the "capacitor multiplication" that can be achieved to low values.

Figure 9:
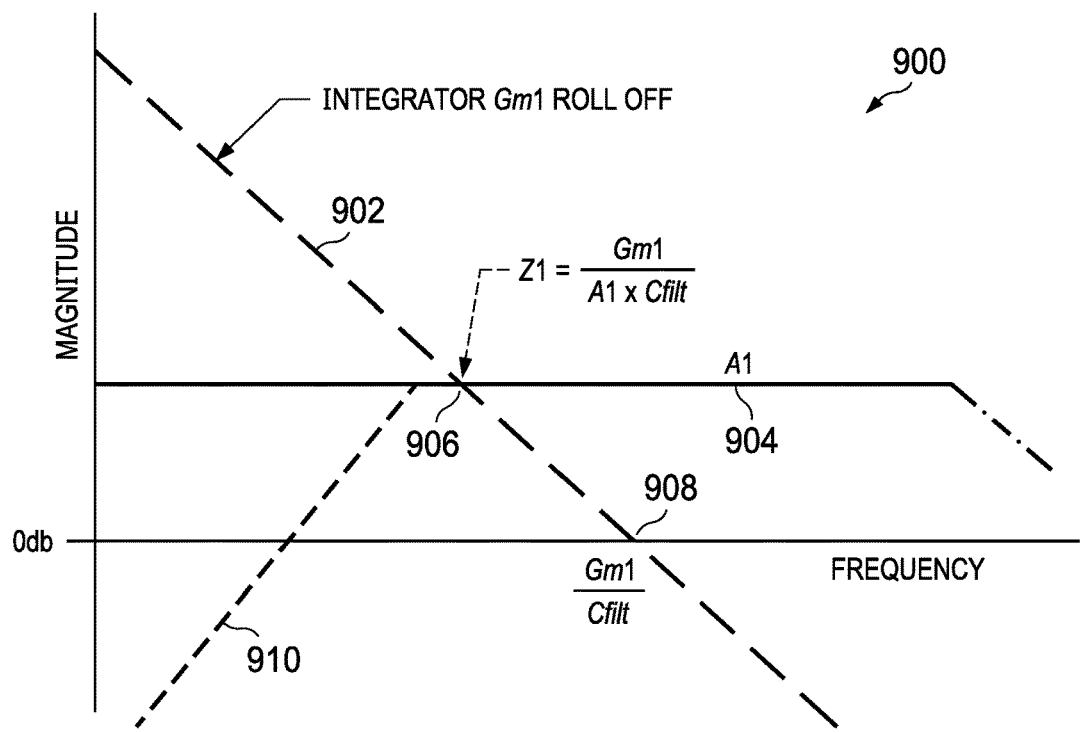
FIG. 9 is a graph showing gain as function of frequency for the reference buffer arrangement of FIG. 8 in accordance with some examples.

FIG. 9 is a graph 900 showing gain as function of frequency for the reference buffer arrangement of FIG. 8 in accordance with some examples. In graph 900, line 902 represents the gain (Gm1) of the transconductance gain stage 804 as a function of frequency. Also, line 904 represents the gain (A1) of the first gain stage 806 as a function of frequency. As can be seen in graph 900, the position of the zero ($f_z$) is lowered from $$\frac{Gm_1}{2\pi C_{FILT}} \text{ to } \frac{Gm_1}{2\pi \times A1 \times C_{FILT}}.$$

Figure 10:
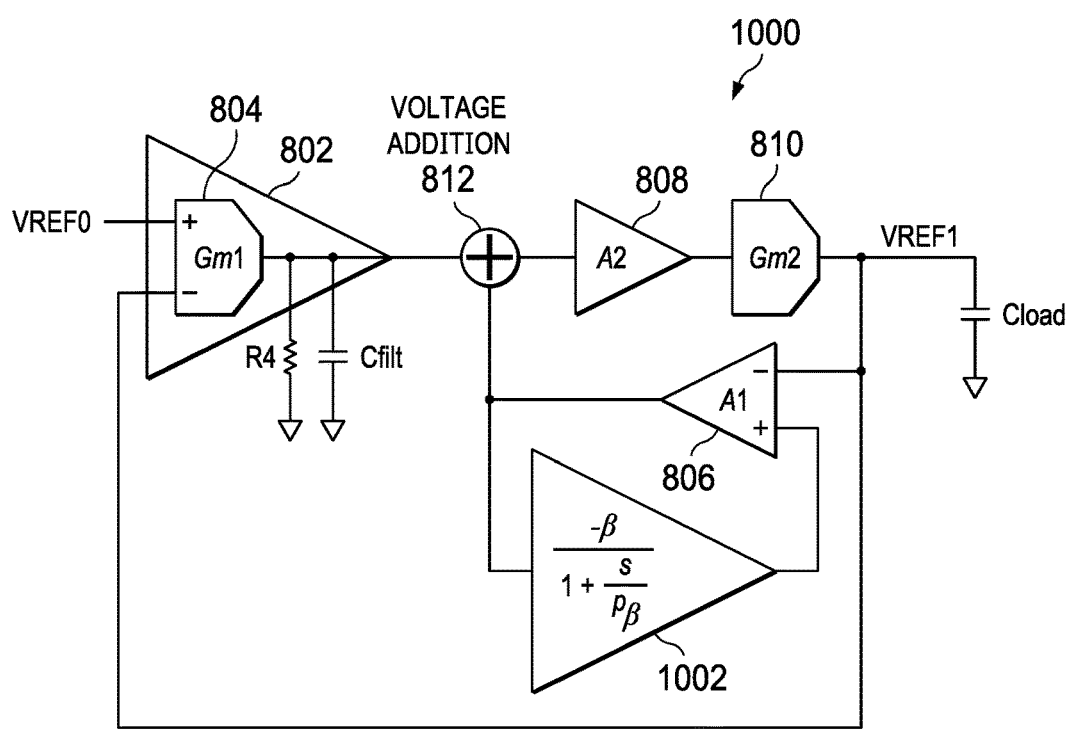
FIG. 10 is a schematic diagram showing another reference buffer arrangement in accordance with some examples.

With the reference buffer arrangement 800, the differential offset, which is a direct-current (DC) phenomenon, is multiplied by the gain of the first gain stage 806 at DC. This differential offset is present at the output of the first gain stage 806. To maintain the zero position at $$\frac{Gm_1}{2\pi \times A1 \times C_{FILT}},$$

the gain of first gain stage 806 needs to be A1 at the zero-frequency represented by arrow 906. However, at DC, the gain of first gain stage 806 can be lower than A1 (see e.g., line 910). If the DC gain of the first gain stage 806 is lower than A1, then the differential offset will only be multiplied by this lower gain at DC. In the graph 900, the point 908 is located at the unity gain crossing frequency (Gm1/2π $C_{FILT}$) of the integrator 802. In this example, the frequency up to which the noise is integrated by the integrator 802 is Gm1/2π A1 $C_{FILT}$ FIG. 10 is a schematic diagram showing another reference buffer arrangement 1000 in accordance with some examples. In the reference buffer arrangement 1000, the same components described in the reference buffer arrangement 800 of FIG. 8 are represented with a low-pass feedback loop 1002 added for the first gain stage 806. With the reference buffer arrangement 1000, the reduction of gain for the first gain stage 806 at low frequencies can be achieved using the low-pass feedback loop 1002. In some examples, the low-pass feedback loop 1002 applied a first-order filter $$\left( \text{e.g., } \frac{-\beta}{1 + \frac{s}{p_\beta}} \right).$$

This ensures that the gain of first gain stage 806 is reduced $$\left( \text{e.g., to } \frac{1}{\beta} \right)$$

at DC, hence the differential offset will not saturate the first gain stage 806. In some examples, the pole of the low-pass feedback loop 1002 is much lower than the zero frequency $$\left(e.g., p_\beta \ll \frac{2\pi f_z}{\beta \times A1}\right).$$

In such case, a heavy low-pass filter is used, but there is no noise requirement for the low-pass filter. Accordingly, the low-pass filter can be achieved by a small capacitor and a large resistor (or a switched cap resistor), which is realizable on-chip.

Figure 11:
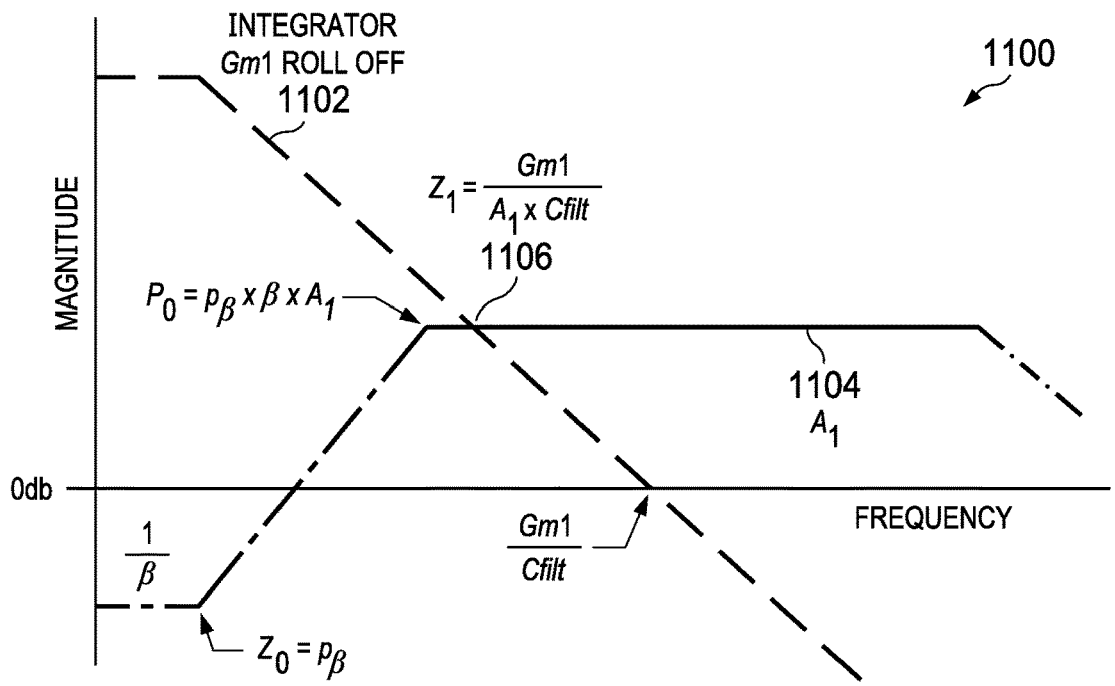
FIG. 11 is a graph showing gain as function of frequency for the reference buffer arrangement of FIG. 10 in accordance with some examples.

FIG. 11 is a graph 1100 showing gain as function of frequency for the reference buffer arrangement of FIG. 10 in accordance with some examples. In graph 1100, line 1102 represents the gain (Gm1) of the transconductance gain stage 804 as a function of frequency. Also, line 1104 represents the gain (A1) of the first gain stage 806 as a function of frequency. As can be seen in graph 1100, the position of the zero ($f_z$) is lowered from $$\frac{Gm_1}{2\pi C_{FILT}} \text{ to } \frac{Gm_1}{2\pi \times A_1 \times C_{FILT}}.$$

With the reference buffer arrangement 1000, the differential offset is multiplied by the gain of the first gain stage 806 at DC, where this differential offset is present at the output of the first gain stage 806. To maintain the zero position at $$\frac{Gm_1}{2\pi \times A_1 \times C_{FILT}},$$

the gain of first gain stage 806 needs to be A1 at the zero-frequency represented by arrow 1106. At DC, the gain of first gain stage 806 is lower than A1 (e.g., the gain is at DC). With the gain of the first gain stage 806 lower than A1 at DC, the differential offset will only be multiplied by this lower gain at DC.

Figure 12:
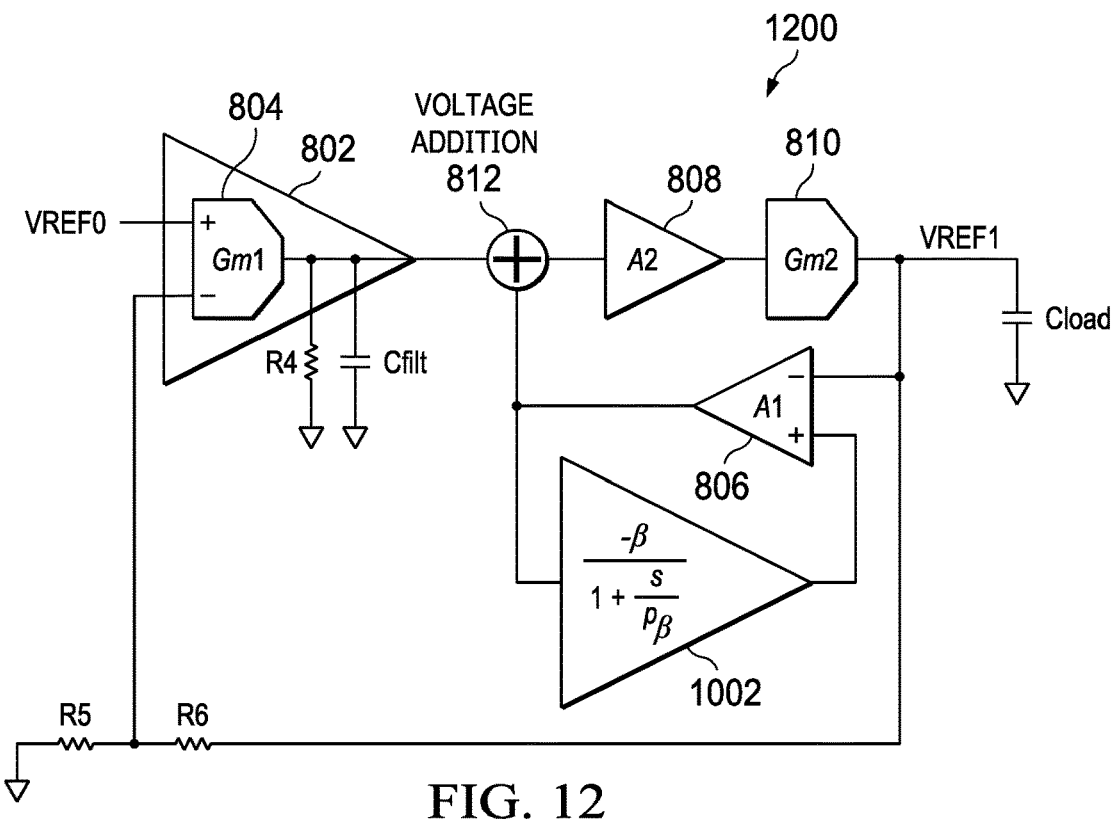
FIG. 12 is a schematic diagram showing another reference buffer arrangement in accordance with some examples.

FIG. 12 is a schematic diagram showing another reference buffer arrangement 1200 in accordance with some examples. In the reference buffer arrangement 1200, the same components described in the reference buffer arrangement 1000 of FIG. 10 are represented with a voltage divider (R5 and R6) added between the output node of the reference buffer arrangement 1200 and the integrator 802. This voltage divider provides a gain that is only integrated above the zero frequency ($Z_1$). With the reference buffer arrangement 1200, only one external reference is needed (VREF0). In some examples, the flicker noise of the first gain stage 806 is filtered using a second-order filter. Accordingly, the reference buffer arrangement 1200 provides more flicker noise filtering compared to other buffer references. In some examples, the reference buffer arrangement 1200 is applicable for band gaps with integrated reference buffers. Also, with the reference buffer arrangement 1200, a single external capacitor (Cload) is used to provide a low noise integrated voltage reference (VREF1 in FIG. 1) with buffer. Also, Cfilt in the reference buffer arrangement 1200 is an internal capacitor, which avoids potential piezoelectric issues for external ceramic capacitors (e.g., MLCC capacitors).

In some examples, the reference buffer arrangement 1200 has the following behavior:

$$V_{nout}(f \leq Z_1)[Gm_1] \sim \frac{KT}{A_1 \times C_{FILT}}, \quad \text{Equation (14)}$$

$$V_{nout}(f \leq Z_1)[A_1] \sim V_{nA_1} \times \frac{\left(1 + \frac{s}{p_\beta}\right)}{\beta} \times \frac{s * A_1 * C_{FILT}}{Gm_1}, \quad \text{Equation (15)}$$

$$V_{nout}(f \leq Z_1)[\beta] \sim \frac{KT}{Gm_1 \times R \times C_\beta}, \text{ and} \quad \text{Equation (16)}$$

$$BW_{BUF} = A_1 A_2 Gm. \quad \text{Equation (17)}$$

In equations 14-17, $V_{nout}(f \leq Z_1)[Gm_1]$ is the noise at the output of the reference buffer arrangement 1200 for frequencies $\leq Z_1$ (see Equation 12) due to the transconductance gain stage 804, K is the Boltzmann constant, T is temperature (in Kelvin), $A_1$ is the gain of the first gain stage 806, $A_2$ is the gain of the second gain stage 808, $C_{FILT}$ is the value of Cfilt, $V_{nout}(f \leq Z_1)[A_1]$ is the noise at the output of the reference buffer arrangement 1200 for frequencies $\leq Z_1$ due to the first gain stage 806, $V_{nA_1}$ is the noise at the output of the reference buffer arrangement 1200 due to the first gain stage 806, s is frequency, $\rho$ is the pole of the low pass network in feedback, $\beta$ is the gain of the low pass network at low frequencies, $Gm_1$ is the gain of the transconductance gain stage 804, $V_{nout}(f \leq Z_1)[\beta]$ is the noise at the output of the reference buffer arrangement 1200 for frequencies $\leq Z_1$ due to $\beta$, R is the resistance of the low pass network, $C_\beta$ is the capacitor used in the low pass network, $BW_{BUF}$ is the bandwidth of the reference buffer arrangement 1200, and Gm is the gain of the transconductance gain stages 804 and 810.

Figure 13:
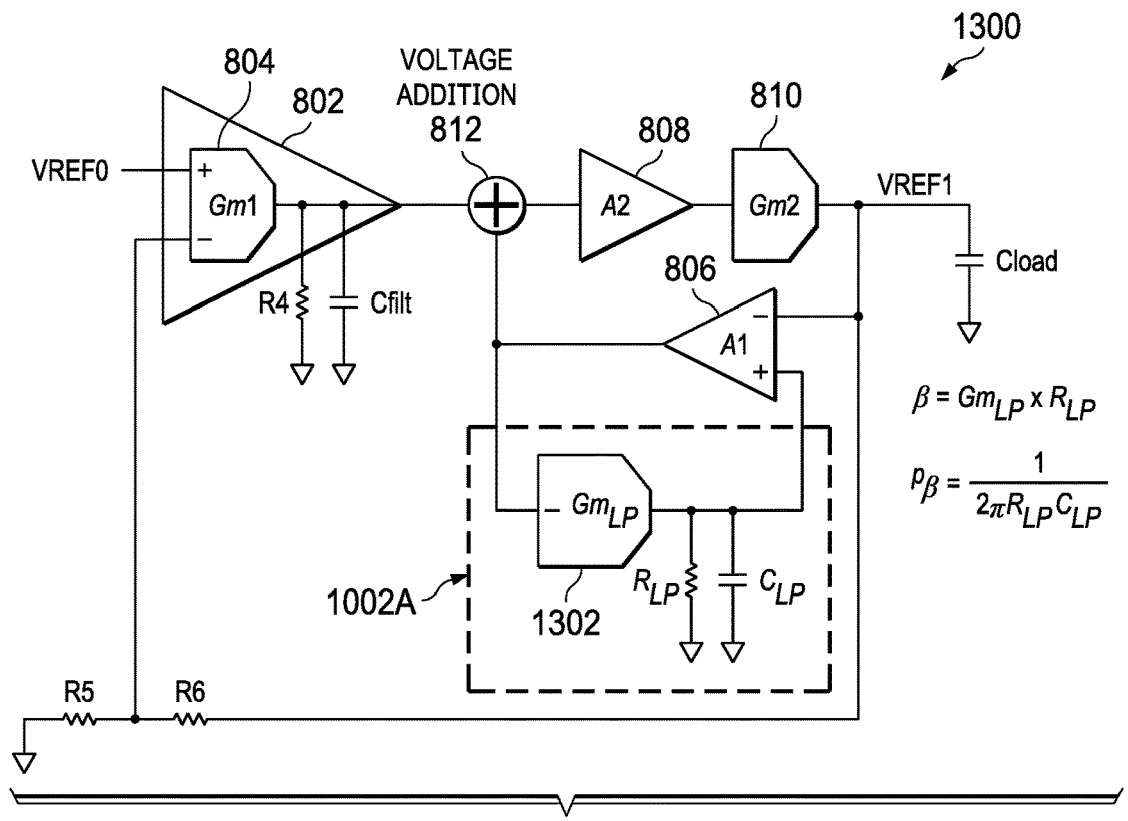
FIGS. 13-16 are schematic diagram showing other reference buffer arrangements in accordance with some examples.

FIG. 13 is a schematic diagram showing another reference buffer arrangement 1300 in accordance with some examples. In the reference buffer arrangement 1300, many of the same components described for the reference buffer arrangement 1200 of FIG. 12 are represented. In addition, the reference buffer arrangement 1300 includes a low-pass feedback loop 1002A (an example of the low-pass feedback loop 1002 in FIGS. 10 and 12) with a negative low-pass transconductance gain ($-Gm_{LP}$) stage 1302, a low-pass resistor ($R_{LP}$) and a low-pass capacitor ($C_{LP}$) coupled to the positive (+) input node of the first gain stage 806. As shown, a first (e.g., top) plate of $C_{LP}$ is coupled to the + input node of the first gain stage 806 and a second (e.g., bottom) plate of $C_{LP}$ is coupled to a ground node. Also, a first end of $R_{LP}$ is coupled to the + input node of the first gain stage 806 and a second end of $R_{LP}$ is coupled to a ground node. Also, an input of the $-Gm_{LP}$ stage 1302 is coupled to the + input node of the first gain stage 806, and an output of the $-Gm_{LP}$ stage 1302 is coupled to the voltage addition circuit 812. With the reference buffer arrangement 1300, the low-pass feedback loop 1002A applies a first-order filter (e.g., $$\frac{-\beta}{1 + \frac{s}{p_\beta}},$$

where $\beta = Gm_{LP} \times R_{LP}$ and $p_\beta = \frac{1}{2}\pi R_{LP} C_{LP}$). Together, the low-pass feedback loop 1002A and the integrator 802 apply a second-order filter.

Figure 14:
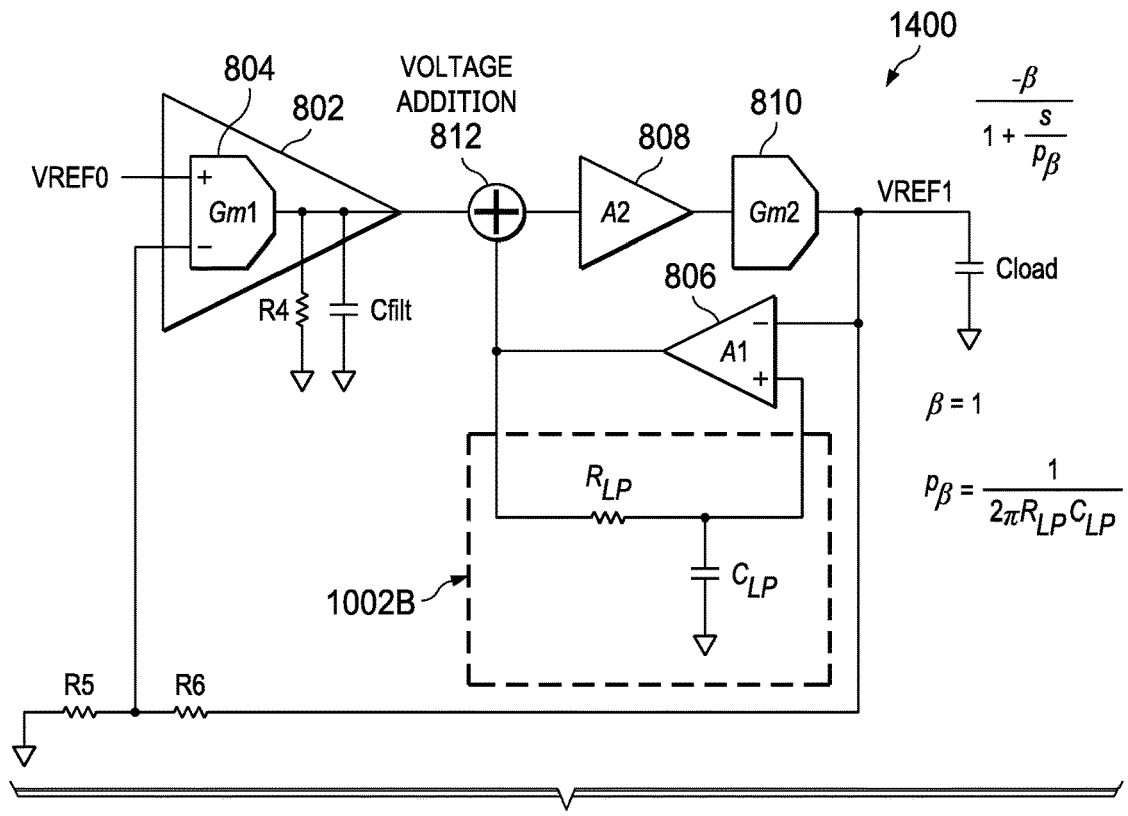

FIG. 14 is a schematic diagram showing another reference buffer arrangement 1400 in accordance with some examples. In the reference buffer arrangement 1400, many of the same components described for the reference buffer arrangement 1200 of FIG. 12 are represented. In addition, the reference buffer arrangement 1400 includes a low-pass feedback loop 1002B (an example of the low-pass feedback loop 1002 in FIGS. 10 and 12) with a low-pass resistor ($R_{LP}$) and a low-pass capacitor ($C_{LP}$) coupled to the positive (+) input node of the first gain stage 806. As shown, a first (e.g., top) plate of $C_{LP}$ is coupled to the + input node of the first gain stage 806 and a second (e.g., bottom) plate of $C_{LP}$ is coupled to a ground node. Also, a first end of $R_{LP}$ is coupled to the + input node of the first gain stage 806 and a second end of $R_{LP}$ is coupled to the voltage addition circuit 812. With the reference buffer arrangement 1300, the low-pass feedback loop 10026 applies a first-order filter (e.g., $$\frac{-\beta}{1+\frac{s}{p_\beta}},$$

where $\beta=1$ and $p_\beta=\frac{1}{2}\pi R_{LP}C_{LP}$). Together, the low-pass feedback loop 10026 and the integrator 802 apply a second-order filter.

Figure 15:
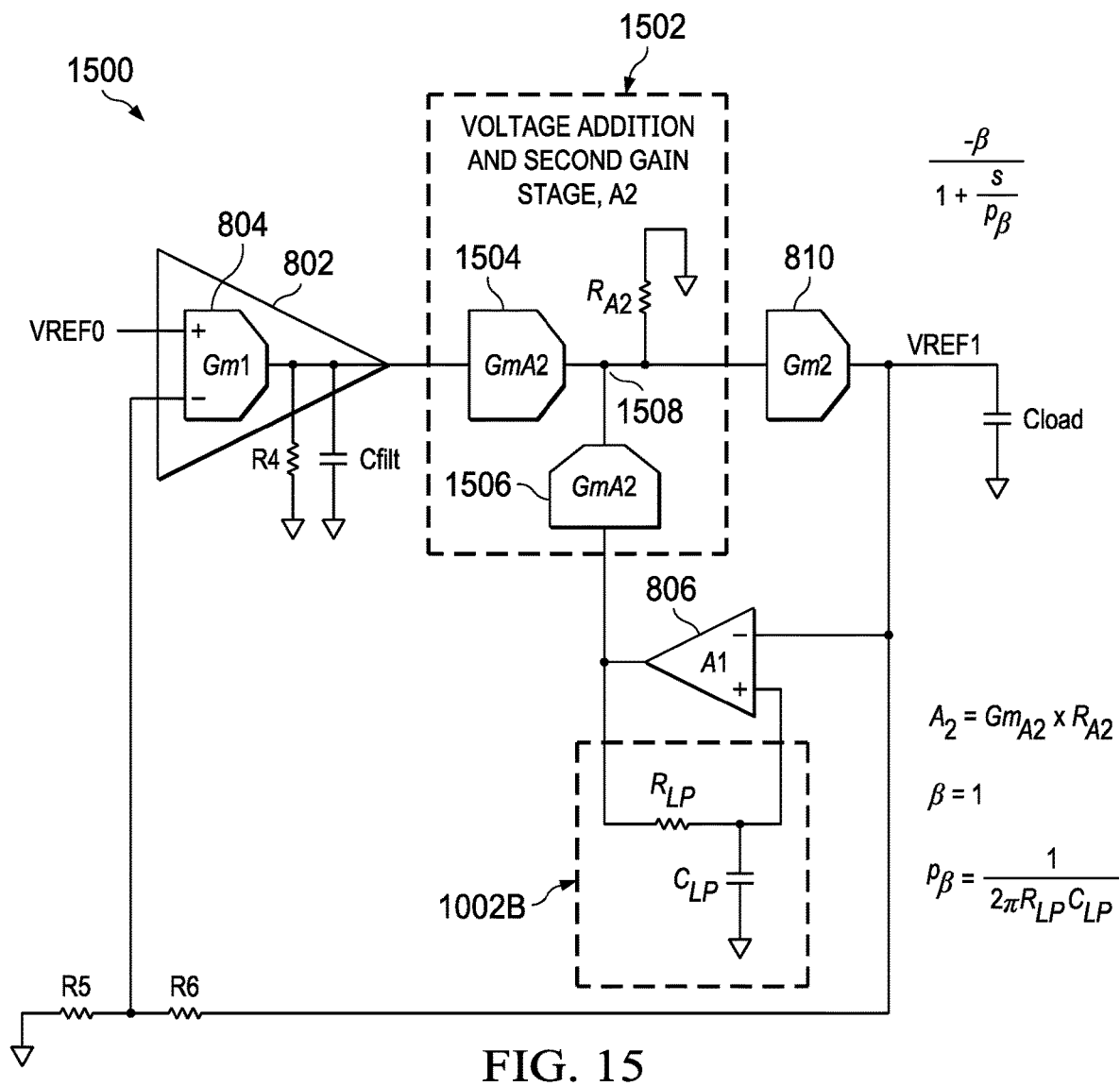

FIG. 15 is a schematic diagram showing another reference buffer arrangement 1500 in accordance with some examples. In the reference buffer arrangement 1500, many of the same components described for the reference buffer arrangement 1200 of FIG. 12 are represented. In addition, the reference buffer arrangement 1500 includes circuit 1502, which is an example of the voltage addition circuit 812 and the second gain stage (A2) 808. As shown, the circuit 1502 comprises transconductance gain (Gm) stages 1504 and 1506 to provide A2. More specifically, the input for the transconductance gain stage 1504 is coupled to the output of the integrator 802. Also, the input for the transconductance gain stage 1506 is coupled to the output of the first gain stage 806 and to the output of the low-pass feedback loop 10026. The outputs of the transconductance gain stages 1504 and 1506 are combined at node 1508, which is coupled to the transconductance gain stage 810. As shown, the circuit 1502 also includes a resistor ($R_{A2}$) coupled between the node 1508 and a ground node. With the reference buffer arrangement 1500, the low-pass feedback loop 1002B applies a first-order filter (e.g., $$\frac{-\beta}{1+\frac{s}{p_\beta}},$$

where $\beta=1$ and $p_\beta=\frac{1}{2}\pi R_{LP}C_{LP}$). Together, the low-pass feedback loop 10026 and the integrator 802 apply a second-order filter. Also, A2 for the reference buffer arrangement 1500 is $Gm_{A2} \times R_{A2}$, where $Gm_{A2}$ is the transconductance of the second gain stage (A2) provided by the transconductance gain stages 1504 and 1506, and where $R_{A2}$ is the value of $R_{A2}$ in the circuit 1502.

Figure 16:
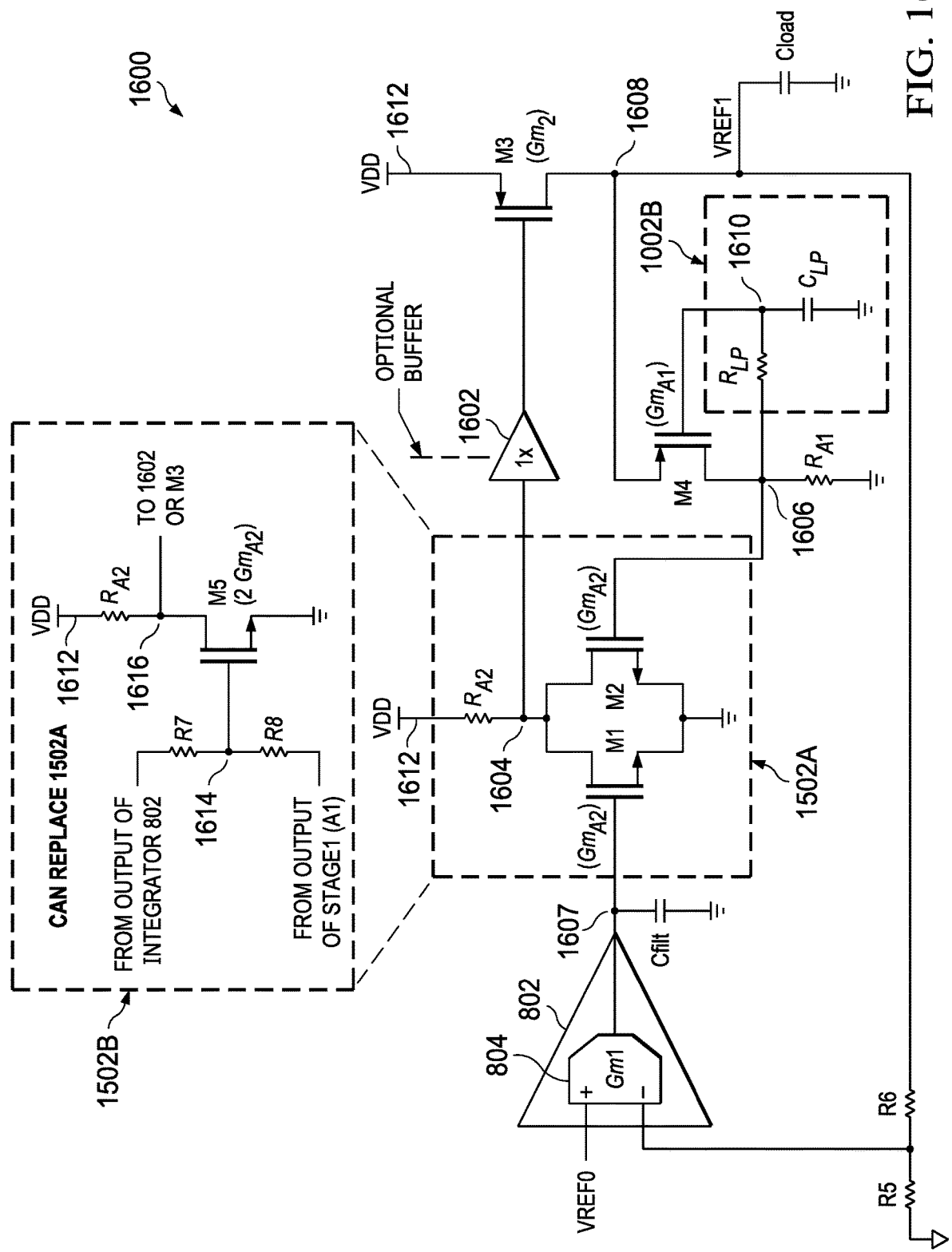

FIG. 16 is a schematic diagram showing another reference buffer arrangement 1600 in accordance with some examples. In the reference buffer arrangement 1600, many of the same components described for the reference buffer arrangement 1200 of FIG. 12 are represented. In addition, the reference buffer arrangement 1600 includes the low-pass feedback loop 10026 (an example of the low-pass feedback loop 1002 in FIGS. 10 and 12) discussed in FIG. 14. Also, the reference buffer arrangement 1600 includes circuit 1502A (an example of the circuit 1502 in FIG. 15).

As shown, the circuit 1502A includes two transistors, M1 and M2, corresponding to the transconductance gain stages 1504 and 1506 to provide A2 in FIG. 15. As shown, the control terminal of M1 is coupled to the output node 1607 of the integrator 802. Also, the first current terminals of M1 and M2 are coupled to a node 1604 (the output node of the second gain stage in FIG. 16). Meanwhile, the second current terminals of M1 and M2 are coupled to a ground node. Also, the control terminal of M2 is coupled to a node 1606 (the output node for the first gain stage in FIG. 16) at the output of the low-pass feedback loop 10026. In the example of FIG. 16, the node 1606 is the input to the low-pass feedback loop 10026 and is the output of the first gain stage formed by another transistor, M4. Also, the node 1610 is the output of the low-pass feedback loop 1002B, which provides a signal to the control terminal for the first gain stage formed by M4.

In the example of FIG. 16, M4 and $R_{A1}$ are an example of the first gain stage 806 described herein. More specifically, the first current terminal of M4 is coupled to the output node 1608 of the reference buffer arrangement 1600, the second current terminal of M4 is coupled to the node 1606, and the control terminal of M4 is coupled to the low-side feedback loop 1002B (at the node 1610 between $C_{LP}$ and $R_{LP}$). As shown, $R_{A1}$ is coupled between the node 1606 and a ground node.

Returning to the circuit 1502A, a resistor ($R_{A2}$) is coupled between an input supply (VDD) node 1612 and the node 1604 (the output node of the second gain stage in FIG. 16). In the example of FIG. 16, the circuit 1502A is an example of the voltage addition circuit 812 and the second gain stage (A2) 808, where M1, M2, and $R_{A2}$ are an example of the second gain stage 808. Meanwhile, the node 1604 is an example of the voltage addition circuit 812. As shown, the node 1604 is coupled to the control terminal of a transistor (M3), which is an example of the transconductance stage 810. In some examples, a buffer circuit 1602 is placed between the node 1604 and the control terminal of M3. As shown, the first current terminal of M3 is coupled to the VDD node 1612, and the second current terminal of M3 is coupled to the output node 1608.

In some examples of the reference buffer arrangement 1600, another circuit 1502B (an example of the circuit 1502 in FIG. 15) is used instead of the circuit 1502A. As shown, the circuit 1502B includes two resistors, R7 and R8, coupled in series between the output of the integrator 802 and the output of the first gain stage (e.g., the node 1606 in FIG. 16). More specifically, a first end of R7 is coupled to the output of the integrator 802 and a second end of R7 is coupled to a node 1614 between R7 and R8. Also, a first end of R8 is coupled to the node 1614, and a second end of R8 is coupled to the output of the first gain stage (e.g., the node 1606 in FIG. 16). As shown, the circuit 1502B also includes a transistor (M5) having its control terminal coupled to the node 1614. Also, the first current terminal of M5 is coupled to a node 1616, where $R_{A2}$ is coupled between the node 1616 and the VDD node 1612. Also, the second current terminal of M5 is coupled to a ground node. As shown, the node 1616 is coupled to the buffer 1602 or to M3. In the example of FIG. 16, M5 and $R_{A2}$ are an example of the second gain stage 808 described herein. Also, in the example of FIG. 16, A1 is $Gm_{A1} \times R_{A1}$ and A2 is $Gm_{A2} \times R_{A2}$.

Without limitation to other examples, an example system (e.g., the system 100 of FIG. 1) includes a reference buffer (e.g., the reference buffer 102 of FIG. 1) coupled to an input supply voltage (e.g., VREF0 in FIG. 1). The system also includes an ADC (e.g., the ADC 112 in FIG. 1) coupled to an output of the reference buffer. The system also includes an output capacitor (e.g., Cload in FIG. 1) coupled between the output of the reference buffer and a ground node. In some examples, a reference buffer (e.g., the reference buffer 102) includes an integrator (e.g., the integrator 104 of FIG. 1, the integrator 802 in FIGS. 8, 10, and 12-16) and an internal capacitor (e.g., the internal capacitor 106 in FIG. 1, or Cfilt in FIGS. FIGS. 8, 10, and 12-16) coupled between an output of the integrator and a ground node.

The reference buffer also includes a first gain stage (e.g., the first gain stage 108 in FIG. 1, the first gain stage 806 in FIG. 8, 10, 12-15, or M4 and $R_{A1}$ in FIG. 16) with an input coupled to the output of the reference buffer, wherein an output of the first gain stage is combined with the output of the integrator using a combine circuit (e.g., the voltage addition circuit 812 in FIGS. 8, 10, 12-15, components of the circuit 1502 in FIG. 15, components of the circuit 1502A in FIG. 16, or components the circuit 1502B in FIG. 16). The reference buffer also includes a second gain stage (e.g., A2, the second gain stage 110 in FIG. 1, the second gain stage 808 in FIGS. 8, 10, 12-14, components of the circuit 1502 in FIG. 15, components of the circuit 1502A in FIG. 16, or components of the circuit 1502B in FIG. 16) with an input coupled to the output of the integrator (104, 802). In some examples, the combine circuit uses passive resistive components such as R7 and R8 in the circuit 1502B of FIG. 16 to combine the output of the first gain stage with the output of the integrator. In other examples, the combine circuit uses active resistive components such as M1 and M2 in the circuit 1502A of FIG. 16 to combine the output of the first gain stage with the output of the integrator.

In some examples, the first gain stage for a reference buffer (e.g., sometimes referred to as "A1" or "$A_1$" herein, the first gain stage 108 in FIG. 1, or the first gain stage 806 in FIGS. FIGS. 8, 10, 12-15) comprises a transistor (e.g., M4 in FIG. 16) having a first current terminal coupled to the output of the reference buffer, a second current terminal coupled to the second gain stage (e.g., sometimes referred to as "A2" or "$A_2$" herein, the second gain stage 110, the second gain stage 808 in FIGS. 8, 10, 12-14, components of the circuit 1502 in FIG. 15, components of the circuit 1502A in FIG. 16, or components of the circuit 1502B in FIG. 16), and a control terminal coupled to a low-pass feedback loop (e.g., the low-pass feedback loop 1002 in FIGS. 10 and 12, the low-pass feedback loop 1002A in FIG. 13, or the low-pass feedback loop 1002B in FIGS. 14-16) of the first gain stage.

In some examples, the low-pass feedback loop of the first gain stage is configured to apply a first-order filter. In such case, the low-pass feedback loop and the integrator are configured provide second-order filtering of noise of the first gain stage. By strategic selection of the second-order filtering, the internal capacitor (Cfilt), and the gain of the first gain stage a predetermined noise level and distortion level at the output of the reference buffer is achieved using the output capacitor (Cload) as the only external capacitor for the reference buffer.

In some examples, the second gain stage of a reference buffer comprises a transistor (e.g., M5 in FIG. 16) having a first current terminal coupled to a transconductance gain stage (e.g., sometimes referred to as "Gm2" or "$Gm_2$" herein, the transconductance gain stage 810 in FIG. 8, 10, 12-15, or M3 in FIG. 16), a second current terminal coupled to the ground node, and a control terminal coupled to the output of the first gain stage via a first resistor (e.g., R8 in FIG. 16) of a combine circuit (e.g., the voltage addition circuit 812 in FIGS. 8, 10, 12-14). In this example, the control terminal of the transistor for the second gain stage is also coupled to the output of the integrator via a second resistor (e.g., R7 in FIG. 16) of a combine circuit (e.g., the voltage addition circuit 812 in FIGS. 8, 10, 12-14).

In some examples, the second gain stage of a reference buffer comprises two transistors (e.g., M1 and M2 in FIG. 16). In this example, one transistor (e.g., M1) comprises a first current terminal coupled to the transconductance gain stage, a second current terminal coupled to the ground node, and a control terminal coupled to the output of the integrator. Meanwhile, the other transistor (e.g., M2) comprises a first current terminal coupled to the transconductance gain stage, a second current terminal coupled to the ground node, and a control terminal coupled to the output of the first gain stage. With this second gain stage example, the transistors are used as resistive components of the combine circuit (e.g., the voltage addition circuit 812 in voltage addition circuit 812 in FIGS. 8, 10, 12-14).

In different examples, various components (e.g., the integrator 104, the internal capacitor 106, the first gain stage 108, the second gain stage 110, and the voltage addition circuit 812) of a reference buffer are part of a single integrated circuit (IC). In such examples, the output capacitor is external to the IC. Also, in different examples, at least some of the system components (e.g., an ADC at the output of the reference buffer) are included with the same IC as the reference buffer or are on separate ICs coupled to the IC with the reference buffer (e.g., a multi-chip module arrangement or printed circuit board arrangement).

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A system, comprising:
a reference buffer having a supply voltage input and a reference output;
an analog-to-digital converter (ADC) coupled to the reference output; and
an output capacitor (Cload) coupled between the reference output and ground,
wherein the reference buffer comprises:
an integrator;
a capacitor coupled between an output of the integrator and ground;
a first gain stage with an input coupled to the reference output, wherein an output of the first gain stage is added with the output of the integrator using a voltage addition; and
wherein the voltage addition circuit comprises a second gain stage.

2. The system of claim 1, wherein the first gain stage comprises a transistor having a first current terminal coupled to the reference output, a second current terminal coupled to the second gain stage, and a control terminal coupled to a low-pass feedback loop of the first gain stage.

3. The system of claim 2, wherein the transistor is a first transistor, wherein the second gain stage comprises a second transistor having a first current terminal coupled to a transconductance gain stage, a second current terminal coupled to ground, and a control terminal coupled to the output of the first gain stage via a first resistor of the voltage addition circuit, and wherein the control terminal is coupled to the output of the integrator via a second resistor of the voltage addition circuit.

4. The system of claim 2, wherein the transistor is a first transistor, and wherein the second gain stage comprises a second transistor and a third transistor,
wherein the second transistor comprises:
a first current terminal coupled to a transconductance gain stage;
a second current terminal coupled to ground; and
a control terminal coupled to the output of the integrator, and
wherein the third transistor comprises:
a first current terminal coupled to the transconductance gain stage;
a second current terminal coupled to ground; and
a control terminal coupled to the output of the first gain stage.

5. The system of claim 4, wherein the second and third transistors are used as resistive components of the voltage addition circuit.

6. The system of claim 2, wherein the low-pass feedback loop is configured to apply a first-order filter.

7. The system of claim 6, wherein the low-pass feedback loop and the integrator provide second-order filtering of noise of the first gain stage.

8. The system of claim 7, wherein the reference buffer is part of a single integrated circuit, and wherein the second-order filtering, the capacitor, and a gain of the first gain stage are selected to provide a predetermined noise level and distortion level at the reference output using the output capacitor as the only external capacitor for the reference buffer.

9. An integrated circuit, comprising:
a reference buffer having:
an integrator;
a capacitor coupled between an output of the integrator and ground;
a first gain stage with an input coupled to an output of the reference buffer, wherein an output of the first gain stage is added with the output of the integrator using a voltage addition circuit; and
wherein the voltage addition circuit comprises a second gain stage.

10. The integrated circuit of claim 9, further comprising a transconductance gain stage between an output of the second gain stage and the output of the reference buffer.

11. The integrated circuit of claim 9, wherein the combine circuit is configured to voltage addition the output of the integrator and the output of the first gain stage using passive resistive components.

12. The integrated circuit of claim 9, wherein the voltage addition circuit is configured to add the output of the integrator and the output of the first gain stage using active resistive components.

13. The integrated circuit of claim 9, wherein the first gain stage comprises a low-pass feedback loop configured to apply a first-order filter.

14. The system of claim 13, wherein the low-pass feedback loop and the integrator provide second-order filtering of noise of the first gain stage.

15. A reference buffer circuit, comprising:
an integrator;
a capacitor coupled between an output of the integrator and ground;
a first gain stage with a low-pass feedback loop, wherein the first gain stage has an input coupled to an output of the reference buffer circuit, and wherein an output of the first gain stage is combined with the output of the integrator; and
a second gain stage with a first input coupled to the output of the integrator and with a second input coupled to the output of the first gain stage.

16. The reference buffer circuit of claim 15, further comprising a transconductance gain stage between an output of the second gain stage and the output of the reference buffer circuit.

17. The reference buffer circuit of claim 16, wherein the first gain stage comprises a transistor having a first current terminal coupled to the output of the reference buffer, a second current terminal coupled to the second input of the second gain stage, and a control terminal coupled to an output of the low-pass feedback loop.

18. The reference buffer circuit of claim 17, wherein the transistor is a first transistor, and wherein the second gain stage comprises a second transistor having:
a first current terminal coupled to an input of the transconductance gain stage;
a second current terminal coupled to ground; and
a control terminal coupled to the first input of the second gain stage.

19. The reference buffer circuit of claim 18, wherein the second gain stage comprises a third transistor having:
a first current terminal coupled to an input of the transconductance gain stage;
a second current terminal coupled to ground; and
a control terminal coupled to the second input of the second gain stage.

20. The reference buffer circuit of claim 15, wherein the low-pass feedback loop is configured to apply a first-order filter, and wherein the low-pass feedback loop and the integrator are configured to provide second-order filtering of noise of the first gain stage.

* * * * *